(12) United States Patent
Sahinoglu et al.

(10) Patent No.: US 9,190,955 B2
(45) Date of Patent: Nov. 17, 2015

(54) METHOD FOR SEPARATING MULTI-COMPONENT SIGNALS

(71) Applicant: Mitsubishi Electric Research Laboratories, Inc., Cambridge, MA (US)

(72) Inventors: Zafer Sahinoglu, Cambridge, MA (US); Philip Orlik, Cambridge, MA (US); Kieran Parsons, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 203 days.

(21) Appl. No.: 14/060,733

(22) Filed: Oct. 23, 2013

(65) Prior Publication Data

US 2015/0109053 A1    Apr. 23, 2015

(51) Int. Cl.
*H03D 5/00* (2006.01)
*H04L 27/32* (2006.01)
*H03D 3/00* (2006.01)

(52) U.S. Cl.
CPC ............ *H03D 3/002* (2013.01); *H03D 5/00* (2013.01); *H04L 27/32* (2013.01)

(58) Field of Classification Search
CPC ........... H03D 5/00; H03D 1/04; H03D 3/002; H04L 27/32; G06F 17/14; G06F 17/16; G06F 17/20; G06K 9/52
See application file for complete search history.

(56) References Cited

U.S. PATENT DOCUMENTS

| 7,529,363 B2* | 5/2009 | Pessoa et al. ................. 379/386 |
| 8,098,720 B2* | 1/2012 | Adduci .......................... 375/224 |
| 8,515,201 B1* | 8/2013 | Murray Herrera et al. ... 382/260 |

OTHER PUBLICATIONS

Santhanam et al., "Multicomponent AM-FM Demodulation via Periodicity-Based Algebraic Separation and Energy-Based Demodulation", IEEE Transactions on Communications, vol. 48, No. 3, Mar. 2000, pp. 473-490.*
Santhanam et.al., multicomponent AM-FM Demodulation via Periodicity-based Algebraic Separation and Energy-based Demodulation, IEEE Trans. Commun., vol. 48, No. 3, Mar. 2000).

* cited by examiner

*Primary Examiner* — Ryan Johnson
(74) *Attorney, Agent, or Firm* — Dirk Brinkman; Gene Vinokur

(57) ABSTRACT

A method separates a multi-component signal by first estimating parameters of the signal. Then, using periodicity-based algebraic separation and energy-based demodulation, the signal is separated into components according to the parameters and constraints. Last, a Teager-Kaiser energy detector is applied to each component to provide a direct current signal for each component, and the constraint for each component used by the separating.

8 Claims, 2 Drawing Sheets

METHOD FOR SEPARATING MULTI-COMPONENT SIGNALS

FIELD OF THE INVENTION

This invention relates in general to sigma processing, and in particular to separating a signal including multiple sinusoidal signals and multiple AM-FM modulated sinusoidal signals into components.

BACKGROUND OF THE INVENTION

FIG. 1 shows a conventional method for separating a multi-component signal. A mixture of amplitude-frequency modulated signals (AM-FM) and sinusoidal signals occurs frequently in acoustics applications, biological systems, and as signals received by vehicular collision avoidance radars that transmit continuous wave frequency modulation (CWFM) signals.

A single component AM-FM sinusoidal signal is represented as $$x(t)=A(t)\cos(2\pi f t+\phi(t)), \quad (1)$$

where A(t) indicates a time-varying amplitude envelope and $\phi$ is the phase angle. A K multi-component signal 110 is given by $$y(t)=\Sigma_{i=1}^{K} A_i(t)\cos(2\pi f_i t+\phi_i(t)), 0<t<T \quad (2)$$

where T is a signal duration.

Gianfelici et. al., in "Multicomponent AM-FM Representations: An Asymptotically Exact Approach," IEEE Trans. Audio, Speech and Language Processing, vol. 15, no. 3, March 2007, describe a method called an Iterated Hilbert Transform (IHT). Generally, the Hilbert transform is a linear operator that takes a function, u(t), and produces a function, H(u)(t) in the same domain. The IHT can be used to estimate instantaneous frequencies of the components 150 of the signal in equation (2). The performance of IHT is suboptimal when the amplitude of a component is within a close range, e.g., $A_2/A_1=2$, in a two component case. The IHT is followed by a Teager-Kaiser energy detector (TKED) based frequency estimator 160, which outputs 170 direct current (DC) component signals.

Santhanam et al., in "Multicomponent AM-FM Demodulation via Periodicity-based Algebraic Separation and Energy-based Demodulation," IEEE Trans. Commun., vol. 48. no. 3, March 2000, describe a method called PASED 150, which is a non-linear method that can separate mixed periodic signals with similar strengths.

PASED works well even when the signals have a small spectral separation. However, PASED needs to know both the period of each signal component and the number of components in the mixture.

Therefore, PASED is generally prefaced by a Double Differencing Function (DDF) 120 to estimate the parameters of the input signal. The parameters include the number of components and their periods. With noisy signals, DDE is also suboptimal.

Therefore, the conventional PASED 130 may not output an optimal separation in low signal-to-noise-ratio (SNR) cases. The PASED also uses a zero DC constraint 140 for each sinusoid expected to be in the multi-component signal. If the signal is not integrated over the correct period of a sinusoid, then the DC-constraint is violated, because the integration does not result in a zero value.

SUMMARY OF THE INVENTION

The embodiments of the invention provide a method for separating a multi-component signal into components using Periodicity-based Algebraic Separation and Energy-based Demodulation (PASED).

The embodiments use an enhanced PASED that iteratively determines an optimal signal separation, when the DDF is subject to errors, as described above. The enhanced PASED replaces the zero DC constraints with constraints in a form of linear prediction coefficients.

Instead of relying on a single estimate of the signal periods, the method iterates to improve the signal separation. The PASED is cascaded by a bank of well-known Teager-Kaiser energy detector (TKED) operators, one for each signal component. The TKED operator converts a sinusoidal signal into a direct current (DC) signal.

The output of the TKED is fed back to adjust the estimates of the periods used in PASED. The zero DC constraints in the conventional PASED are replaced by constraints in the sine wave in the form of linear-prediction-filter coefficients.

DETAILED DESCRIPTION OF THE PREFERRED EMBODIMENTS

Figure 1:
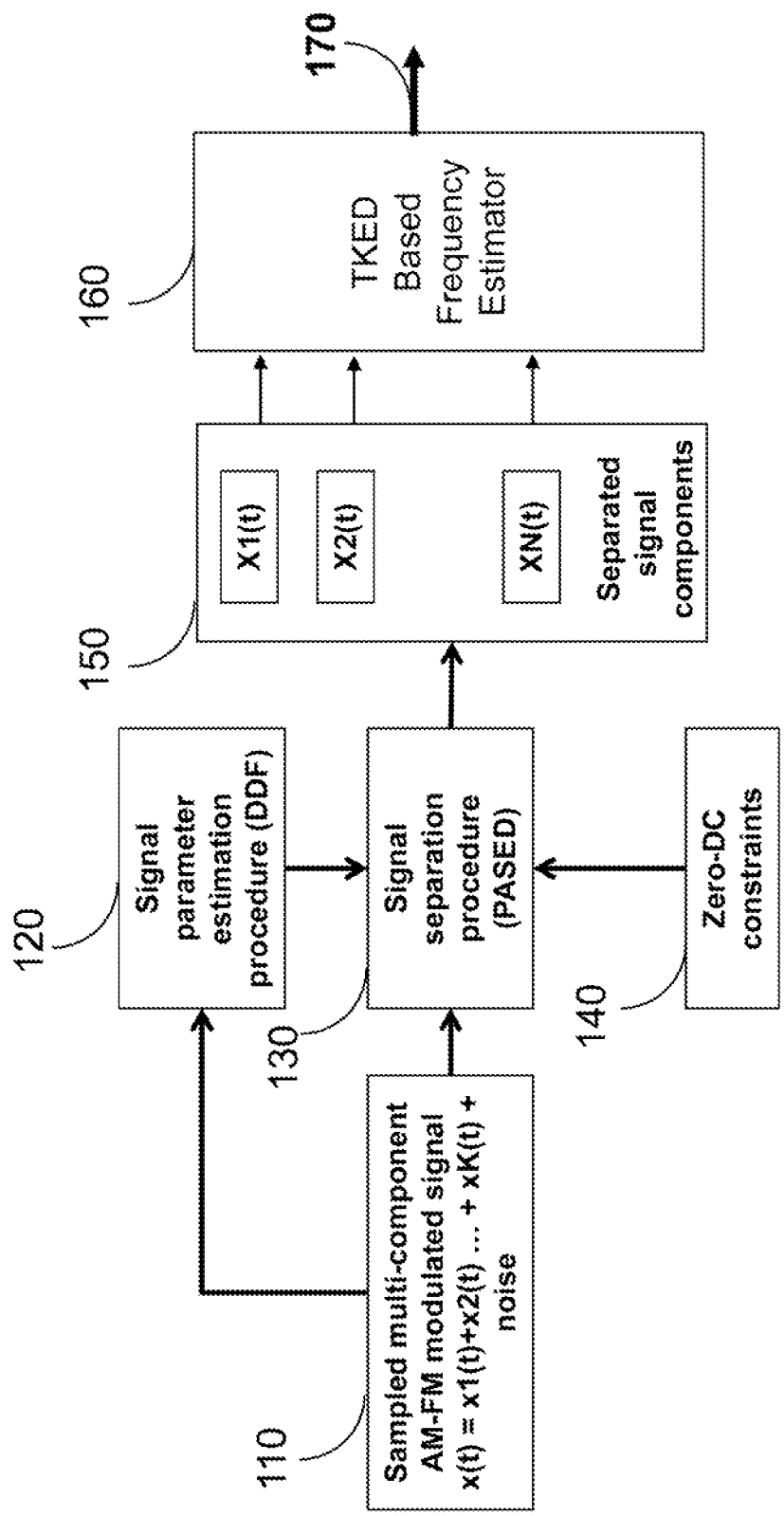
FIG. 1 is a block diagram of a conventional method for signal separation.
Figure 2:
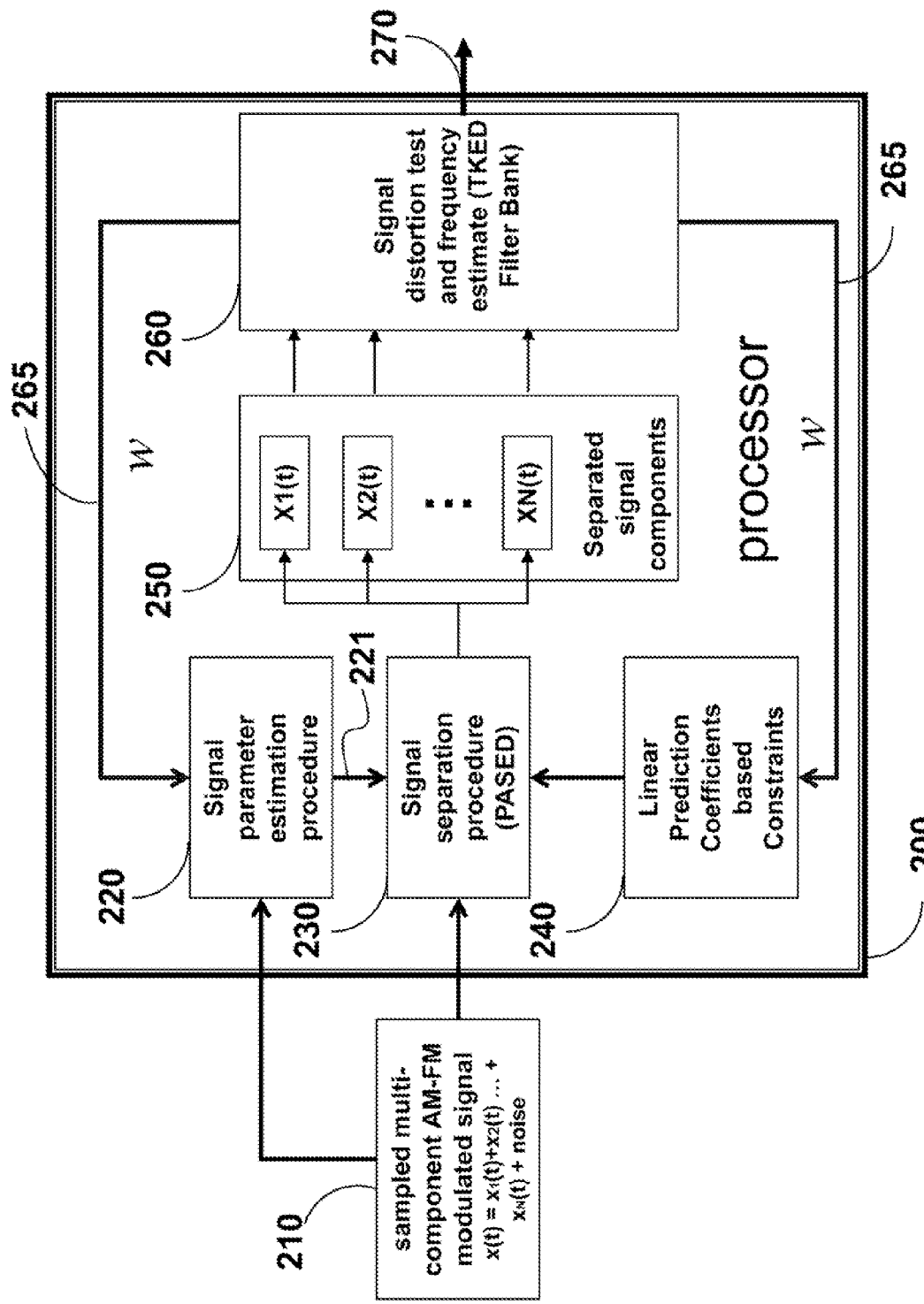
FIG. 2 is a block diagram of a method for signal separation according to embodiments of the invention.

As shown in FIG. 2, the embodiments of the invention provide a method for separating an input multi-component signal 210 into components 270 using Periodicity-based Algebraic Separation and Energy-based Demodulation (PASED). The multi-component signal can be represented as $$x(t)=x_1(t)+x_2(t), \ldots ,+x_N(t)+\text{noise}.$$

The method can be performed in a processor 200 connected to memory and input/output interfaces by buses as known in the art.

PASED Method

Components $z_1(n)$ and $z_2(n)$ of a two component signal are respectively periodic in intervals $N_1$ and $N_2$, such that $$z_1(n)=z_1(n+N_1)$$

$$z_2(n)=z_2(n+N_2).$$

The multi-component signal z(n) includes $z_1(n)$ and $z_2(n)$ and noise w(n), such that $$z_g(n)=z_1(n)+z_2(n)+w(n)=z_1(n+N_1)+z_2(n+N_2)+w(n). \quad (3)$$

If at least $N_1+N_2-1$ signal samples are measured, then the signals $z_1(n)$ and $z_2(n)$ can be separated. If $N_1$ and $N_2$ are estimated inaccurately, then the separation performance is degraded.

The composite signal samples $z_g(n)$ for n=1, 2, ..., N can be represented in a matrix given by $$\begin{bmatrix} z_g(1) \\ z_g(2) \\ \dots \\ z_g(N) \end{bmatrix} = \begin{bmatrix} I_{N_1} & I_{N_2} \\ I_{N_1} & I_{N_2} \\ \dots & \dots \end{bmatrix} \times \begin{bmatrix} z_{g_1}(1) \\ \dots \\ z_{g_1}(N_1) \\ z_{g_2}(1) \\ \dots \\ z_{g_2}N_2 \end{bmatrix}, \quad (4)$$

or alternatively as $z_g = Sz$, where the rank of S is equal to $$\text{rank}(S) = N_1 + N_2 - \gcd(N_1, N_2), \quad (5)$$

where gcd represents the greatest common divisor, and $I_{Ni}$ is the identity matrix of order $N_i$. If gcd $(N_1, N_2) = M$, then, the PASED method needs M constraints for separability. These M constraints, defined by a matrix C, are augmented to the original equation as follows.

$$\begin{bmatrix} z_g \\ 0 \end{bmatrix} = \begin{bmatrix} S \\ C \end{bmatrix} \times [z]. \quad (6)$$

The estimate of the signals produced by PASED is given by $$\hat{z} = (S^T S + C^T C)^{-1} S^T \hat{z}_g \quad (7)$$

such that $$\hat{z}_1 = \hat{z}(1, 2, \dots, N_1) \text{ and } \hat{z}_2 = \hat{z}(N_1 + 1, \dots N_1 + N_2).$$

A sampled sinusoid may not have a zero DC when the input signal length is not an integer multiple of its fundamental period of the signal. The original PASED method ignores this fact, and therefore its performance suffers. In the present invention, constraints in a form of linear prediction coefficients 240 of a sinusoid are used to produce exact zero DC constraints.

A double differencing function (DDF) is used to estimate 220 parameters 221 of the input signal. The parameters include the number of components and period of the components. In the presence of additive white Gaussian noise (AWGN), the DDF based estimates 220 of the input signals are imperfect. Unfortunately, the PASED 230 is sensitive to imperfect period estimates (errors in $N_1$ and $N_2$). Therefore, an adaptive estimate of w is needed via a feedback loop 265 from the TKED 760.

Teager-Kaiser Energy Detector (TKED) Operator

The TKED operator 260 functions as a frequency-to-DC converter. An output 270 of the Operator includes a DC signal for each component. The DC signals are proportional to squares of the amplitude and frequency of the input sinusoidal signal 210. A discrete-time representation of the TKED operator is $$\phi(s(n)) = (s(n))^2 - (s(n-1)s(n-2).$$

Enhanced PASED

The enhanced PASED 230 takes the multi-component signal 210 as input. Let $\theta = [K, N_1, \dots, N_K]$ denote the signal parameters 221 to be estimated, where K is the number of components in the composite signal and $N_i$ is the period of the $i^{th}$ component for $i = 1, 2, \dots, K$. The DDF 220 is used to estimate these parameters. After $\hat{\theta}$ is available, the matrix S is formed as in equation (4).

The enhanced PASED method uses linear prediction coefficients of sinusoids to form the zero DC constraints. For instance, for a sinusoid of $v(n) = A \cos(wn)$, where A is amplitude and is the frequency in radian, three sample linear prediction coefficient filter satisfies $$v(n) - 2v(n-1)\cos(w) + v(n-2) = 0. \quad (8)$$

The linear prediction coefficient filter can be designed in any length, e.g., $N_1$, $N_2$) Equality in equation (8) is satisfied only when w is the true frequency. The DDF 220 only provides an estimate of w. Therefore, this estimate is subject to error. The invention uses the TKED output w 265 as feedback to determine whether w is equal to the true frequency, which becomes a DC level when the values converge and are the same as a termination conditions.

Although the invention has been described by way of examples of preferred embodiments, it is to be understood that various other adaptations and modifications can be made within the spirit and scope of the invention. Therefore, it is the object of the appended s to cover all such variations and modifications as come within the true spirit and scope of the invention.

We claim:

1. A method for separating an input signal, wherein the input signal is a multi-component signal, comprising the steps of:
   estimating parameters of the input signal;
   separating the input signal, using periodicity-based algebraic separation and energy-based demodulation (PASED), into components according to the parameters and constraints; and
   applying a Teager-Kaiser energy detector (TKED) to each component to provide a direct current (DC) signal for each component, and the constraint for each component used by the separating, wherein the steps are performed in a processor.

2. The method of claim 1, wherein the multi-component signal is a mixture of amplitude-frequency modulated signals (AM-FM) and sinusoidal signals.

3. The method of claim 1, wherein frequencies and amplitudes of the multi-component signal vary over time.

4. The method of claim 1, wherein the constraints form exact zero DC constraints.

5. The method of claim 1, wherein the separating and applying are performed iteratively until a termination condition is reached.

6. The method of claim 1, wherein a length of the input signal is not an integer multiple of a fundamental period of the signal.

7. The method of claim 1, wherein the parameters include a number of components and a period of each component.

8. The method of claim 1, wherein the DC signals are proportional to squares of amplitude and frequency of the input signal.

* * * * *